United States Patent
Lee

(10) Patent No.: US 7,068,111 B2
(45) Date of Patent: Jun. 27, 2006

(54) PLL HAVING A MULTI-LEVEL VOLTAGE-CURRENT CONVERTER AND A METHOD FOR LOCKING A CLOCK PHASE USING MULTI-LEVEL VOLTAGE-CURRENT CONVERSION

(75) Inventor: Myung-Woo Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/894,409

(22) Filed: Jul. 19, 2004

(65) Prior Publication Data

US 2005/0110580 A1 May 26, 2005

(30) Foreign Application Priority Data

Jul. 18, 2003 (KR) ...................... 10-2003-0049138

(51) Int. Cl.
*H03L 7/00* (2006.01)
(52) U.S. Cl. .................... 331/17; 331/1 A; 327/159
(58) Field of Classification Search ............... None
See application file for complete search history.

(56) References Cited

U.S. PATENT DOCUMENTS

| | | | | |
|---|---|---|---|---|
| 5,373,257 A | * | 12/1994 | Shimoda | 331/8 |
| 5,382,922 A | * | 1/1995 | Gersbach et al. | 331/1 A |
| 5,629,650 A | * | 5/1997 | Gersbach et al. | 331/17 |
| 5,903,195 A | * | 5/1999 | Lukes et al. | 331/4 |
| 6,466,100 B1 | * | 10/2002 | Mullgrav et al. | 331/179 |
| 6,563,388 B1 | * | 5/2003 | Masenas et al. | 331/17 |
| 6,570,947 B1 | * | 5/2003 | Zipper et al. | 375/376 |

FOREIGN PATENT DOCUMENTS

KR 010062016 7/2001

OTHER PUBLICATIONS

English Abstract***.

* cited by examiner

*Primary Examiner*—Timothy P. Callahan
*Assistant Examiner*—An T. Luu
(74) *Attorney, Agent, or Firm*—F. Chau & Associates, LLC

(57) ABSTRACT

A phase locked loop (PLL) circuit having a multi-level voltage-current converter and a clock phase locking method using multi-level voltage-current conversion are described. The phase locked loop (PLL) circuit generates an output clock signal that is phase-locked to a reference clock signal. Further, the PLL circuit includes a phase detecting unit, a charge pump unit, a current-voltage converting unit, and a voltage control oscillator. The phase detecting unit detects a phase difference between the reference clock signal and the output clock signal. The charge pump unit generates a pumping voltage in response to an up signal or down signal output from the phase detector. The current-voltage converting unit receives the pumping voltage, converts the pumping voltage into a predetermined first current, and outputs a tuning voltage in response to predetermined selection signals. The voltage control oscillator generates the output clock signal with a frequency that is proportional to the tuning voltage.

15 Claims, 7 Drawing Sheets

PLL HAVING A MULTI-LEVEL VOLTAGE-CURRENT CONVERTER AND A METHOD FOR LOCKING A CLOCK PHASE USING MULTI-LEVEL VOLTAGE-CURRENT CONVERSION

CROSS REFERENCE TO RELATED APPLICATION

This application claims priority to Korean Patent Application No. 2003-49138, filed on Jul. 18, 2003, in the Korean Intellectual Property Office, the disclosure of which is hereby incorporated by reference in its entirety.

BACKGROUND

1. Technical Field

The present invention relates to a semiconductor integrated circuit, and more particularly, to a phase locked loop (PLL) having a multi-level voltage-current converter and a method for locking a clock phase using multi-level voltage-current conversion.

2. Discussion of the Related Art

In general, when a clock is needed to operate an integrated circuit in a synchronous system and it receives an external clock signal, a phase locked loop (hereinafter, referred to as a PLL) circuit is used to phase-lock the external clock signal to the internal clock signal.

In a conventional semiconductor integrated circuit, a PLL circuit is used in a cache memory device for improving the speed of data processing between a central processing unit (CPU) and a dynamic random access memory (DRAM) of a computer or in a high-speed memory device such as synchronous DRAM (SDRAM) or Rambus DRAM (RDRAM). A PLL circuit is also used to detect locking signals during recording processes in optical disks. Optical disks such as audio-CDs, CD-ROMs, or DVDs have a locking signal and data magnetically recorded simultaneously whenever a unit of data begins to be recorded. When reproducing recorded data, optical disk reproducing devices detect a sync signal and perform a locking operation, thereby reading recorded data. As a supply voltage of an integrated circuit decreases, a tuning voltage, which controls a voltage controlled oscillator (hereinafter, referred to as a "VCO") of the PLL circuit included in the integrated circuit, also decreases. Since an output frequency of the VCO depends on the tuning voltage, when the tuning voltage level decreases, the output frequency of the VCO also decreases. Hence, it is difficult to design a PLL circuit with a wide frequency range while also having a low tuning voltage.

FIG. 1 illustrates a conventional PLL circuit. Referring to FIG. 1, a PLL circuit 100 includes a phase detector 110, a charge pump unit 120, and a VCO 130. The phase detector 110 detects a phase difference between a reference clock signal REF_CLK and an output clock signal FCLK output from the VCO 130 and generates an up signal UP or a down signal DOWN based on the detected phase difference. The charge pump unit 120 generates a predetermined tuning voltage Vc in response to the up signal UP or the down signal DOWN and controls the VCO 130. The VCO 130 receives the tuning voltage Vc and generates the output clock signal FCLK with a frequency proportional to the tuning voltage Vc. The PLL circuit 100 repeats the aforementioned feedback operation several times until the output clock signal FCLK is phase-locked to the reference clock signal REF_CLK.

The VCO 130 is a core component of the PLL circuit 100 and must be designed to have a wide range of frequency domains in proportion to the tuning voltage Vc. FIG. 2 is a graphical illustration of the relationship between the frequency of the output clock signal FCLK and the tuning voltage Vc. Referring to FIG. 2, ideally, the frequency of the output clock signal FCLK increases from 640 MHz to 1.1 GHz, as the tuning voltage Vc increases from 600 mV to 1.8V, i.e., the frequency of the output clock signal FCLK has a linear property.

Since, when the supply voltage of the integrated circuit decreases, the operating voltage of the PLL circuit 100 also decreases, this leads to the decrease of both the level of the tuning voltage Vc and the frequency of the output clock signal FCLK. Thus, when a system including the PLL circuit 100 operates at a high frequency, the system performance decreases because of the decrease in the frequency of the clock signal output from the PLL. One way to cure this phenomenon is to increase the change rate of the frequency of the output clock signal FCLK according to the changes in the tuning voltage Vc of the VCO 130 of the PLL circuit 100. However, this method increases phase noise of the PLL circuit 100.

To reduce phase noise, a plurality of VCOs can be used to generate output clock signals in different oscillating frequencies according to the level of the tuning voltage Vc. However, the use of the plurality of VCOs results in high power consumption, and increases the complexity of circuit configuration.

A need therefore exists for a PLL circuit that generates an output clock signal having a wide frequency band, and also has reduced phase noise and low power consumption.

SUMMARY OF THE INVENTION

The exemplary embodiments of the present invention provide a PLL circuit that controls a wide frequency range while producing a small amount of phase noise, and a method for locking a clock phase using multi-level voltage-current conversion.

According to one preferred embodiment of the present invention, a phase locked loop (PLL) circuit that generates an output clock signal that is phase-locked to a reference clock signal comprises: a phase detecting unit, a charge pump unit, a current-voltage converting unit, and a voltage control oscillator. The phase detecting unit detects a phase difference between the reference clock signal and the output clock signal and generates an up signal or a down signal based on the detected phase difference. The charge pump unit generates a pumping voltage in response to the up signal or down signal output from the phase detector. The current-voltage converting unit receives the pumping voltage, converts the pumping voltage into a predetermined first current level, and outputs a tuning voltage in response to predetermined selection signals. The voltage control oscillator generates the output clock signal with a frequency that is proportional to the tuning voltage.

Preferably, the voltage-current converting unit comprises a voltage receiving unit, a current copying unit, and a MUX unit. The voltage receiving unit receives the pumping voltage and converts the pumping voltage into the predetermined first current. The current copying unit copies the predetermined first current output from the voltage receiving unit and generates at least two output voltages. The MUX unit selects one of the at least two output voltages in response to the selection signals and outputs the tuning voltage.

The voltage receiving unit comprises a first NMOS transistor, a fifth PMOS transistor, a second NMOS transistor, a fourth NMOS transistor, a third NMOS transistor, a sixth PMOS transistor, and a seventh NMOS transistor. A gate of the first NMOS transistor is connected to a node that receives the pumping voltage. The fifth PMOS transistor is connected between a supply voltage and a drain of the first NMOS transistor and whose gate is connected to a node that receives a bias voltage. The second NMOS transistor is connected between a source of the first NMOS transistor and ground. A source of the fourth NMOS transistor is connected to a node that receives the supply voltage and a gate of the fourth NMOS transistor is connected to a node that receives a first voltage between the fifth PMOS transistor and the first NMOS transistor. The third NMOS transistor is connected between the fourth NMOS transistor and the ground. Gate and drain of the third NMOS transistor are connected to a gate of the second NMOS transistor. The third NMOS transistor constitutes a current mirror with the second NMOS transistor. Source and gate of the sixth PMOS transistor are connected to a node that receives the supply voltage. The seventh NMOS transistor is connected between the sixth NMOS transistor and the ground. Gate and drain of the seventh NMOS transistor are connected to each other. The seventh NMOS transistor provides the first current.

The current copying unit comprises an eighth NMOS transistor, a ninth PMOS transistor, tenth and eleventh PMOS transistors, a first resistor, a second resistor, a twelfth NMOS transistor, and a thirteenth NMOS transistor. Through the eighth NMOS transistor, the first current from the voltage receiving unit flows toward the ground. The ninth PMOS transistor is connected between a node that receives the supply voltage and the eighth NMOS transistor. Drain and gate of the ninth PMOS transistor are connected to each other. Sources of the tenth and eleventh PMOS transistors are connected to a node that receives the supply voltage. Gates of the tenth and eleventh PMOS transistors are connected to the gate of the ninth PMOS transistor. The tenth and eleventh PMOS transistors constitute a current mirror with the ninth PMOS transistor. The first resistor is connected to drains of the tenth and eleventh PMOS transistors. The second resistor is serially connected to the first resistor. The twelfth NMOS transistor is connected between the second resistor and the ground. Through the twelfth NMOS transistor, a sink current that operates the voltage receiving unit flows. Gate and rain of the thirteenth NMOS transistor are connected to the second resistor and a source of the thirteenth NMOS transistor is connected to the ground. The gate of the seventh NMOS transistor of the voltage-current converting unit is connected to a gate of the eighth NMOS transistor, and thus, the seventh NMOS transistor and the eighth NMOS transistor constitute a current mirror. The gate of the third NMOS transistor of the voltage-current converting unit is connected to the gate of the twelfth NMOS transistor of the current copying unit, and thus, the third NMOS transistor and the twelfth NMOS transistor constitute a current mirror.

When the PLL circuit is included in a synchronous memory device such as synchronous dynamic random access memory (SDRAM), it further includes a mode register (MRS) for providing the first through third selection signals.

The PLL circuit further comprises a selection signal generating circuit that comprises a frequency-voltage converting unit, a reference voltage generating unit, a first amp unit, a second amp unit, a first switch, a first switch, a second switch, and a decoding unit. The frequency-voltage converting unit converts a frequency of the reference clock signal into a first voltage. The reference voltage generating unit generates a predetermined first reference voltage and a predetermined second reference voltage. The first amp unit compares the first voltage to the predetermined first reference voltage. The second amp unit compares the first voltage to the predetermined second reference voltage. The first switch forwards an output of the first amp unit to a first latch in response to the reference clock signal. The second switch forwards an output of the second amp unit to a second latch in response to the reference clock signal. The decoding unit inverts an output of the first latch, outputs a first selection signal as the inverted output of the first latch, receives the inverted output of the first latch and the inverted output of the second latch, outputs a second selection signal, and outputs a third selection signal as the output of the second latch. The decoding unit comprises an inverter and a NOR gate. The inverter inverts the output of the first latch and outputs the first selection signal. The NOR gate receives an output of the inverter and an output of the second latch and outputs the second selection signal.

According to another preferred embodiment of the present invention, a clock phase locking method for phase-locking an output clock signal to a reference clock signal comprises detecting a phase difference between the reference clock signal and the output clock signal, generating a pumping voltage in response to the detected phase difference, receiving the pumping voltage and converting the pumping voltage into a predetermined first current, copying the predetermined first current and generating a first through third output voltages, selectively outputting one of the first through third output voltages as a tuning voltage in response to one of a first through third selection signals, and generating the output clock signal with a frequency that is proportional to the tuning voltage.

Preferably, the first through third selection signals are provided by a register such that they are selectively activated according to a frequency range of the reference clock signal.

According to still anther preferred embodiment of the present invention, a clock phase locking method for phase-locking an output clock signal to a reference clock signal comprises detecting a phase difference between the reference clock signal and the output clock signal, generating a pumping voltage in response to the detected phase difference, receiving the pumping voltage and converting the pumping voltage into a predetermined first current, copying the predetermined first current and generating first through third output voltages, converting a frequency of the reference clock signal into a predetermined voltage, generating a first reference voltage and a second reference voltage, comparing the predetermined voltage to the first reference voltage and generating a first selection signal, comparing the predetermined voltage to the second reference voltage and generating a second selection signal, performing a NOR operation on the first selection signal and the second selection signal and generating a third selection signal, selectively outputting the first through third output voltages as a tuning voltage in response to the first through third selection signals, and generating the output clock signal with a frequency that is proportional to the tuning voltage.

Therefore, according to the preferred embodiments of the present invention, the frequency range of the output clock signal of the VCO is divided according to the tuning voltage that is selectively generated in response to the first through third selection signals, thereby reducing the power consumed and generating an output clock signal with a wide frequency range that is phase-locked to the reference clock signal while producing a small amount of jitter and phase noise.

BRIEF DESCRIPTION OF THE DRAWINGS

The features of the present invention will become more apparent by describing in detail an exemplary embodiment thereof with reference to the attached drawings in which.

DETAILED DESCRIPTION OF PREFERRED EMBODIMENTS

Figure 1:
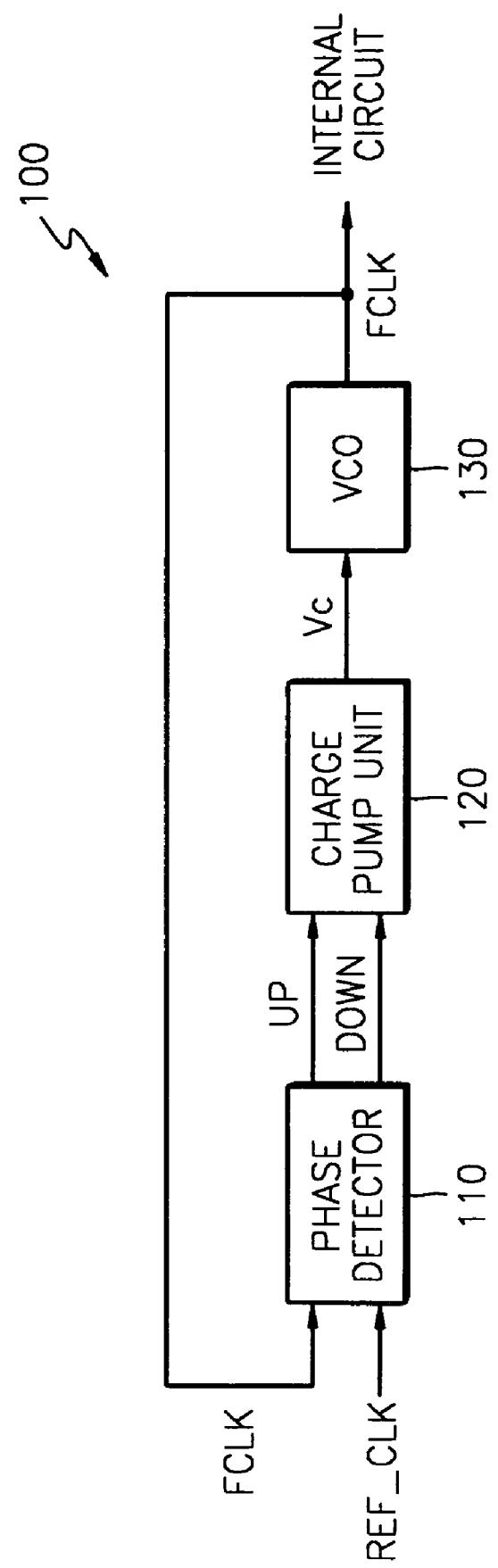
FIG. 1 is a block diagram of a conventional PLL circuit.
Figure 2:
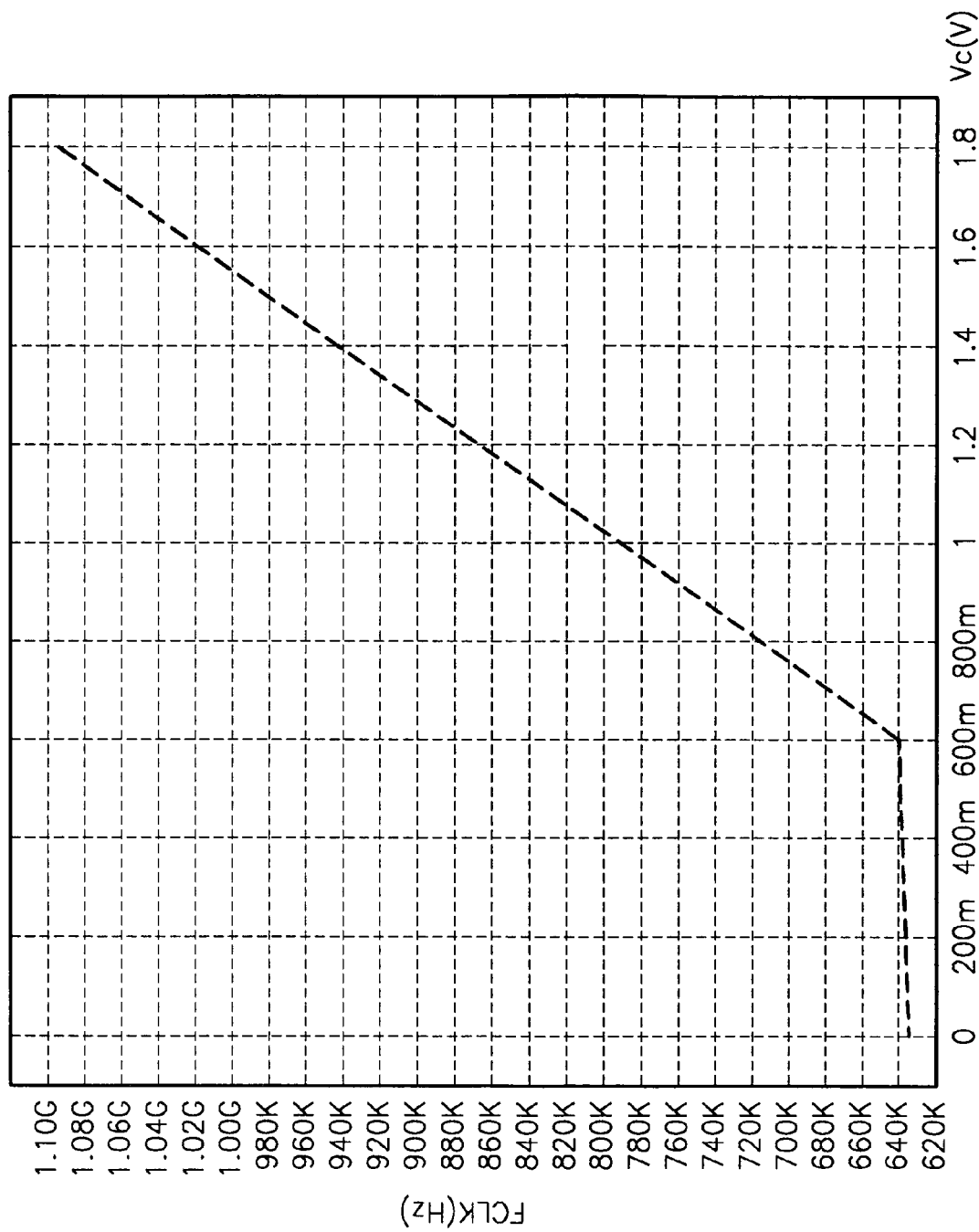
FIG. 2 is a graphical illustration of an operating characteristic of a voltage controlled oscillator (VCO) of FIG. 1.

The embodiments of the present invention will now be described more fully with reference to the accompanying drawings, in which preferred embodiments of the invention are shown. In the drawings, like reference numerals are used to refer to like elements throughout.

Figure 3:
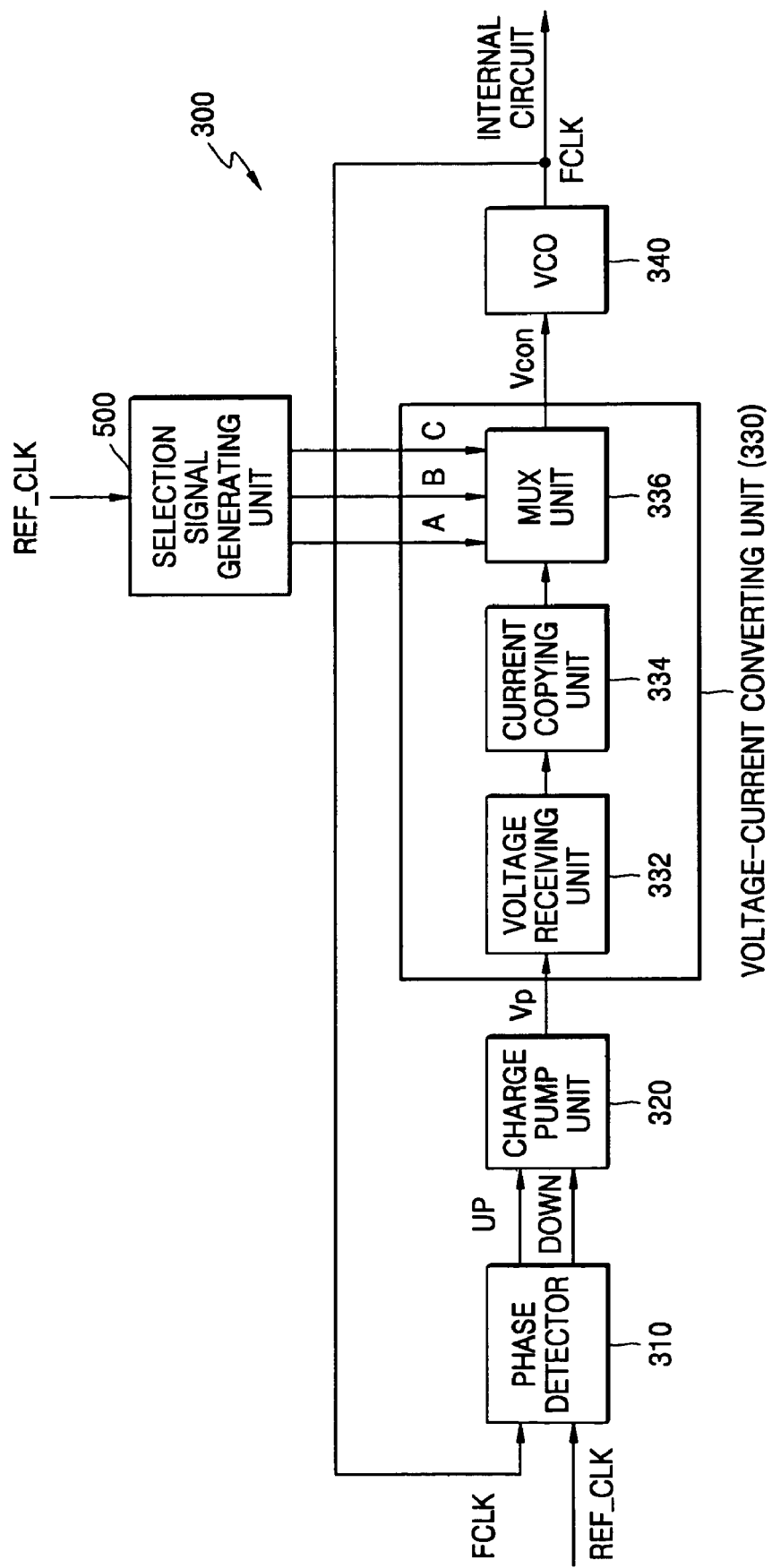
FIG. 3 is a block diagram of a PLL circuit according to a preferred embodiment of the present invention.

FIG. 3 is a schematic block diagram illustrating a PLL circuit according to a preferred embodiment of the present invention. A PLL circuit 300 includes a phase detector 310, a charge pump unit 320, a voltage-current converting unit 330, and a VCO 340. The phase detector 310 detects a phase difference between a reference clock signal REF_CLK and an output signal FCLK output from the VCO 340 and outputs an up signal UP or a down signal DOWN based on the detected phase difference. The charge pump unit 320 outputs a pumping voltage Vp in response to the up signal UP or the down signal DOWN. The voltage-current converting unit 330 receives the pumping voltage Vp and outputs different tuning voltages Vc in response to predetermined first through third selection signals A, B, and C. The voltage-current converting unit 330 includes a voltage receiving unit 332, a current copying unit 334, and a MUX unit 336. The VCO 340 generates the output clock signal FCLK at a frequency proportional to the received tuning voltage Vc. The output clock signal FCLK is also called a recovered clock signal in the sense that the output clock signal FCLK is phase-locked to the reference clock signal REF_CLK.

Figure 4:
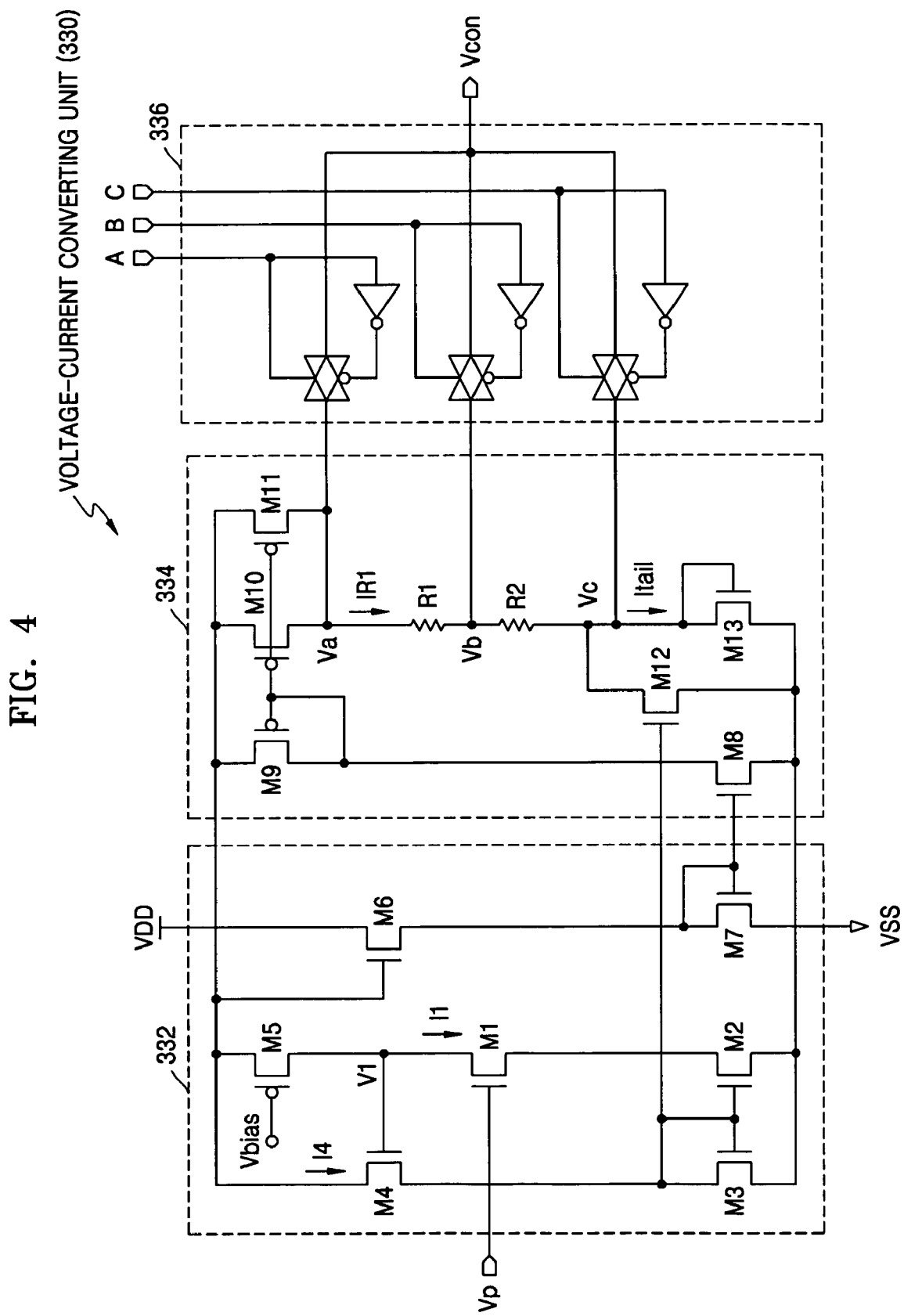
FIG. 4 is a schematic diagram of a voltage-current converting unit of the PLL circuit of FIG. 3.

The voltage-current converting unit 330 is illustrated in detail in FIG. 4. Referring to FIG. 4, the voltage receiving unit 332 receives the pumping voltage Vp and converts the pumping voltage Vp into a predetermined current I6, the current copying unit 334 copies the current I6 and outputs a first through third voltages Va, Vb and Vc, and the MUX unit 336 selects one of the first through third voltages Va, Vb, and Vc in response to the predetermined first through third selection signals A, B, and C.

The voltage receiving unit 332 includes a first transistor M1 through a seventh transistor M7. The first transistor M1 has a gate connected to a node that receives the pumping voltage Vp. The fifth transistor M5 is connected between a node that receives a supply voltage VDD and a drain of the first transistor M1 and has a gate connected to a bias voltage Vbias. The second transistor M2 is connected between a source of the first transistor M1 and a voltage VSS or ground. The fourth transistor M4 has a source connected to a node that receives the supply voltage VDD and has a gate connected to a node that receives a first voltage V1 and is connected between the fifth transistor M5 and the first transistor M1. The third transistor M3 is connected between the fourth transistor M4 and the voltage VSS or ground and has a gate and a drain connected to a gate of the second transistor M2. The third transistor M3 and the second transistor M2 constitute a current mirror. The sixth transistor M6 has a source and a gate connected to a node that receives the supply voltage VDD. The seventh transistor M7 is connected between the sixth transistor M6 and the voltage VSS or ground and has a drain and a gate connected to each other.

In the voltage receiving unit 332, sink current flows through the third transistor M3. The fifth transistor M5 and the second transistor M2 operate in a triode region. The first node voltage V1 changes in response to a change in the pumping voltage Vp, however, the amount of change of the first node voltage V1 is much smaller than that of the pumping voltage Vp, and the change of the first node voltage V1 is proportional to the change of the pumping voltage. The current I6 flowing through the sixth transistor M6 is based on a current I4 flowing through the fourth transistor M4 having a gate connected to the first node voltage V1.

The current copying unit 334 includes the eighth transistor M8 through the thirteenth transistor M13, a first resistor R1, and a second resistor R2. The eighth transistor M8 has a gate connected to the gate of the seventh transistor M7 of the voltage receiving unit 332 and constitutes a current mirror along with the seventh transistor M7. The ninth transistor M9 is connected between a node that receives the supply voltage VDD and the eighth transistor M8 and has a drain and a gate connected to each other. The tenth transistor M10 and the eleventh transistor M11 have their sources connected to a node that receives the supply voltage VDD, their gates connected to the gate of the ninth transistor M9, and both constitute a current mirror along with the ninth transistor M9. The first resistor R1 is connected to the drains of the tenth transistor M10 and the eleventh transistor M11. The second resistor R2 is serially connected to the first resistor R1. The twelfth transistor M12 has a gate connected to the gate of the third transistor M3 of the voltage receiving unit 332 between the second resistor R2 and the voltage VSS or ground. The gate and drain of the thirteenth transistor M13 are connected to the second resistor R2 and the source of the thirteenth transistor M13 is connected to the voltage VSS or ground.

The current I6 flows through the seventh transistor M7 of the voltage receiving unit 332 and flows into the eighth transistor M8, the ninth transistor M9, the tenth transistor M10, and the eleventh transistor M11. The current I4 flows through the third transistor M3 of the voltage receiving unit 332 and flows into the twelfth transistor M12. A predetermined tail current I tail flows into the thirteenth transistor M13 when the twelfth transistor M12 is turned off. Current flowing through the tenth transistor M10 and the eleventh transistor M11 generates the first through third voltages Va, Vb, and Vc at both terminals of the first resistor R1 and the second resistor R2.

The MUX unit 336 switches the first voltage Va into a tuning voltage Vcon in response to the first selection signal A, the second voltage Vb into the tuning voltage Vcon in response to the second selection signal B, or the third voltage Vc into the tuning voltage Vcon in response to the third selection voltage C.

When the PLL circuit 300 of FIG. 3 is applied to a synchronous memory device such as synchronous dynamic random access memory (SDRAM), the first through third selection signals A, B, and C are stored in a mode register (MRS) that is activated according to a frequency range of the reference clock signal REF_CLK. The selection signals are provided to the PLL circuit 300 of FIG. 3. Alternatively, the first through third selection signals A, B, and C may be provided by a selection signal generating circuit.

Figure 5:
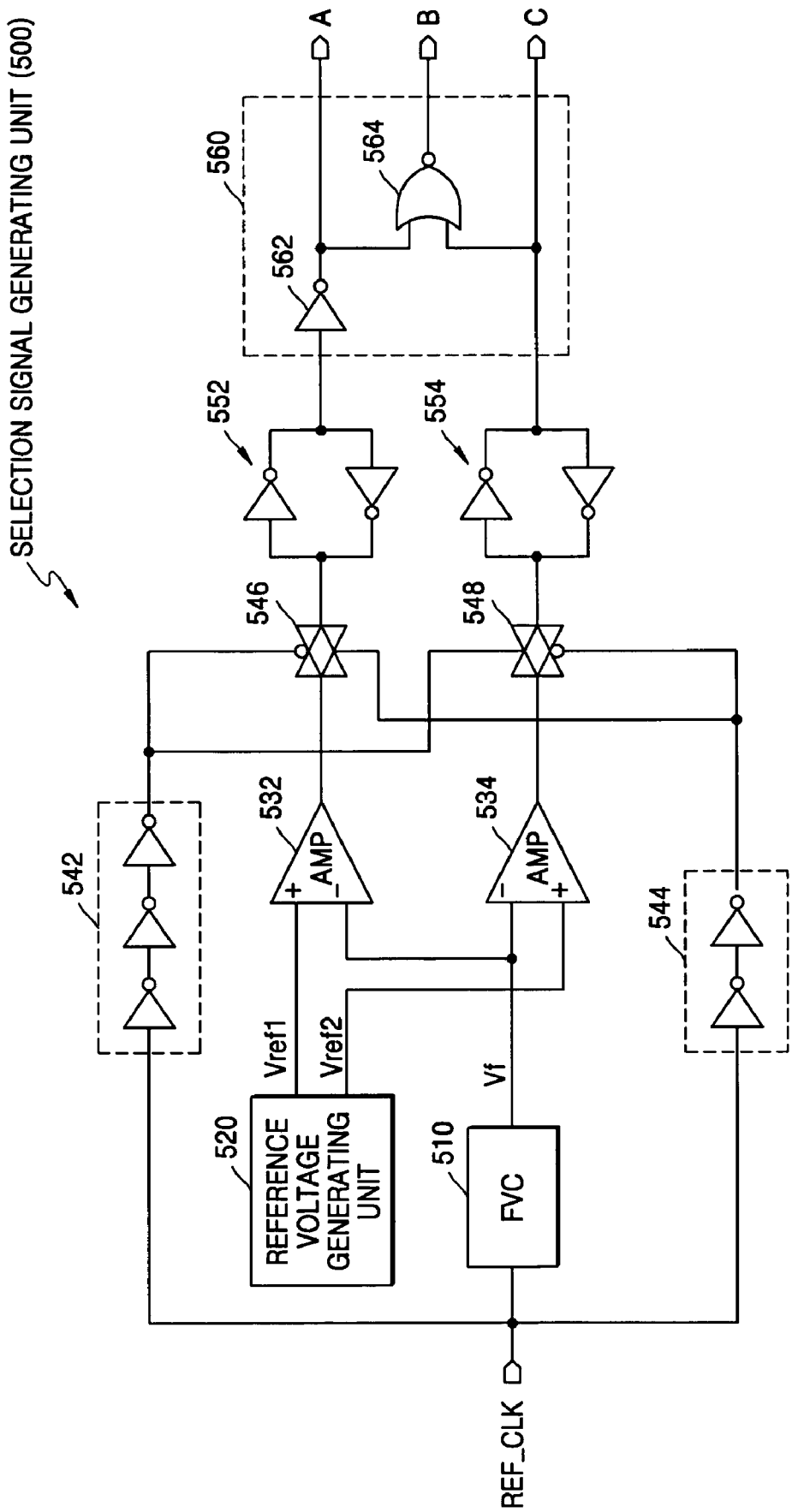
FIG. 5 is a schematic diagram of a selection signal generating circuit.

According to one preferred embodiment of the present invention, the PLL circuit 300 further comprises a selection signal generating circuit. FIG. 5 shows a schematic diagram of the selection signal generating circuit 500. Referring to FIG. 5, the selection signal generating circuit includes a frequency-voltage converting unit 510, a reference voltage generating unit 520, a first amp unit 532, and a second amp unit 534, a first buffer 542, a second buffer 544, a first switch 546, a second switch 548, a first latch 552, a second latch 554, and a decoding unit 560. The selection signal generating circuit 500 generates the first through third selection signals A, B, and C according to the frequency range of the reference clock signal REF_CLK.

The frequency-voltage converting unit 510 converts the frequency of the reference clock signal REF_CLK into a predetermined voltage Vf. The reference voltage generating unit 520 generates a first reference voltage Vref1 and a second reference voltage Vref2. The first amp unit 532 compares the voltage Vf to the first reference voltage Vref1 and the second amp unit 534 compares the voltage Vf to the second reference voltage Vref2. The first buffer unit 542 and the second buffer unit 544 buffer the reference clock signal REF_CLK and turn on the first switch 546 and the second switch 548. The first switch 546 forwards an output of the first amp unit 532 to the first latch 552 and the second switch 548 forwards an output of the second amp unit 534 to the second latch 554. The decoding unit 560 includes an inverter 562 and a NOR gate 564. The inverter 562 inverts an output of the first latch 552 and outputs the first selection signal A. The NOR gate 564 receives an output of the second latch 554 and outputs the second selection signal B. The output of the second latch 554 is the third selection signal C.

The selection signal generating circuit 500 operates as follows. For purpose of illustration, it is assumed that the first reference voltage Vref1 generated in the reference voltage generating unit 520 is about 0.48V and the second reference voltage Vref2 is about 0.57V. Further, the frequency-voltage converting unit 510 has such a characteristic that the voltage Vf decreases when the frequency of the input reference clock signal REF_CLK is higher than a predetermined frequency. For instance, if a reference clock signal REF_CLK with a frequency of 14.89 MHz or higher is input to the frequency-voltage converting unit 510, the level of the voltage Vf is lower than 0.48V.

If the level of the voltage Vf of the frequency-voltage converting unit 510 is lower than 0.48V, the output of the first amp unit 532 and the output of the second amp unit 534 are generated at logic low levels. Thus, the first selection signal A is generated at a logic high level, and the second selection signal B and the third selection signal C are generated at logic low levels. If the voltage Vf is between about 0.48V and about 0.57V, the output of the first amp unit 532 is generated at a logic low level and the output of the second amp unit 534 is generated at a logic high level. Thus, the first selection signal A and the third selection signal C are generated at logic low levels and the second selection signal B is generated at a logic high level. If the voltage Vf is higher than 0.57V, the output of the first amp unit 532 and the output of the second amp unit 534 are generated at logic low levels. Thus, the first selection signal A and the second selection signal B are generated at logic low levels and the third selection signal C is generated at a logic high level.

Referring to FIG. 4, the tuning voltage Vcon is switched to the first voltage Va in response to the first selection signal A, the tuning voltage Vcon is switched to the second voltage Vb in response to the second selection signal B, and the tuning voltage Vcon is switched to the third voltage Vc in response to the third selection signal C.

Figure 6:
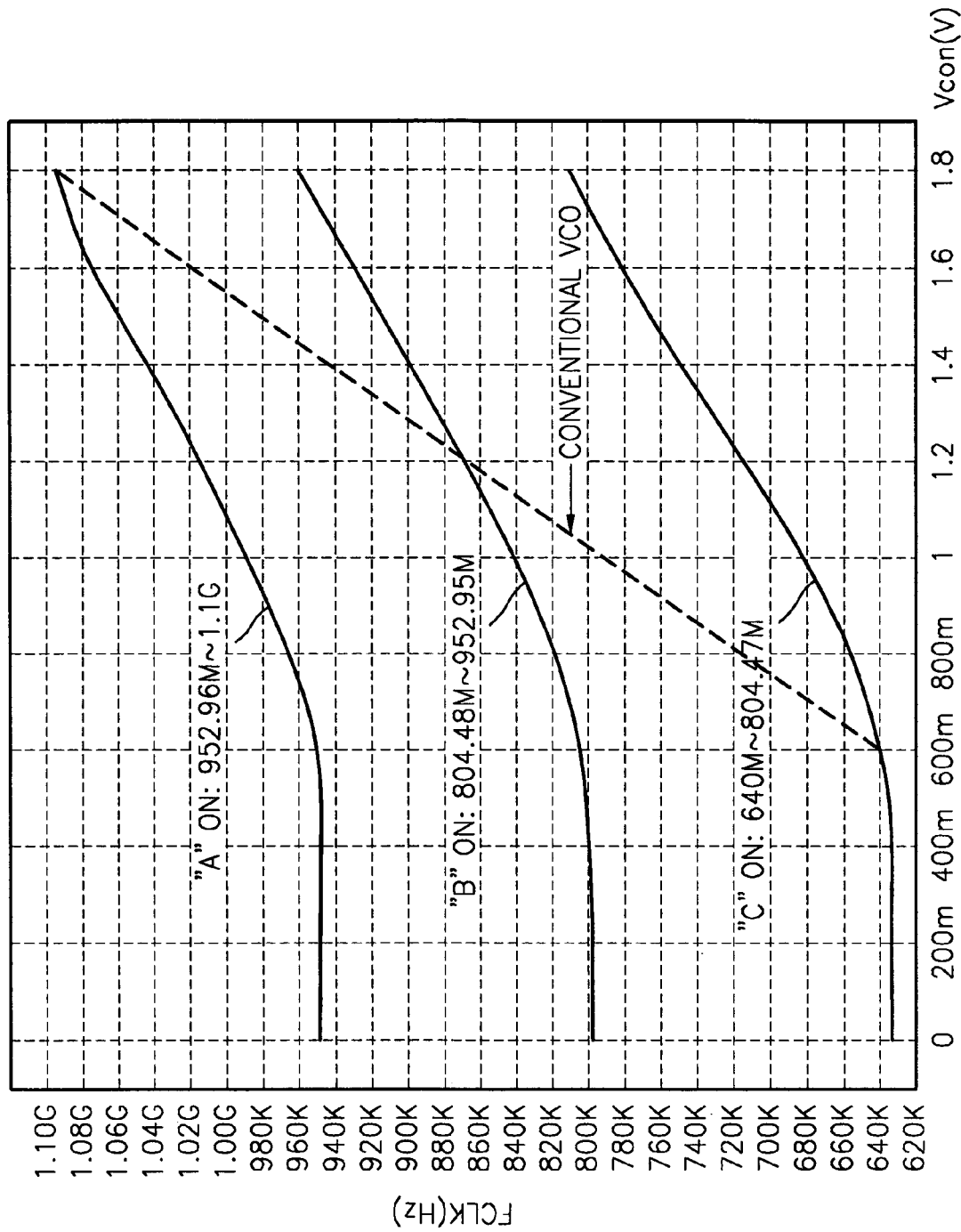
FIG. 6 is a graphical illustration of an operating characteristic of the PLL circuit of FIG. 3.

FIG. 6 is a graphical illustration of the frequency of the output clock signal FCLK generated by the PLL circuit 300 with respect to the tuning voltage Vcon compared to the operating characteristics of the conventional PLL circuit. Referring to FIG. 6, the frequency of the output clock signal FCLK output by the conventional PLL circuit increases linearly from 640 MHz to 1.1 GHz as the tuning voltage Vc increases from 0.6V to 1.8V. In contrast, the output clock signal FCLK output by the PLL circuit 300 has a frequency that ranges from 952.96 MHz to 1.1 GHz in response to activation of the first selection signal A, from 804.48 MHz to 952.95 MHz in response to activation of the second selection signal B, and from 640 MHz to 804.47 MHz in response to activation of the third selection signal C. That is, the PLL circuit 300 outputs clock signals that have the same frequency range as the output clock signal FCLK output by the conventional PLL circuit, however, the frequency range output by PLL 300 is divided into plural parts. According to this embodiment, the frequency range is divided into 3 parts.

Figure 7:
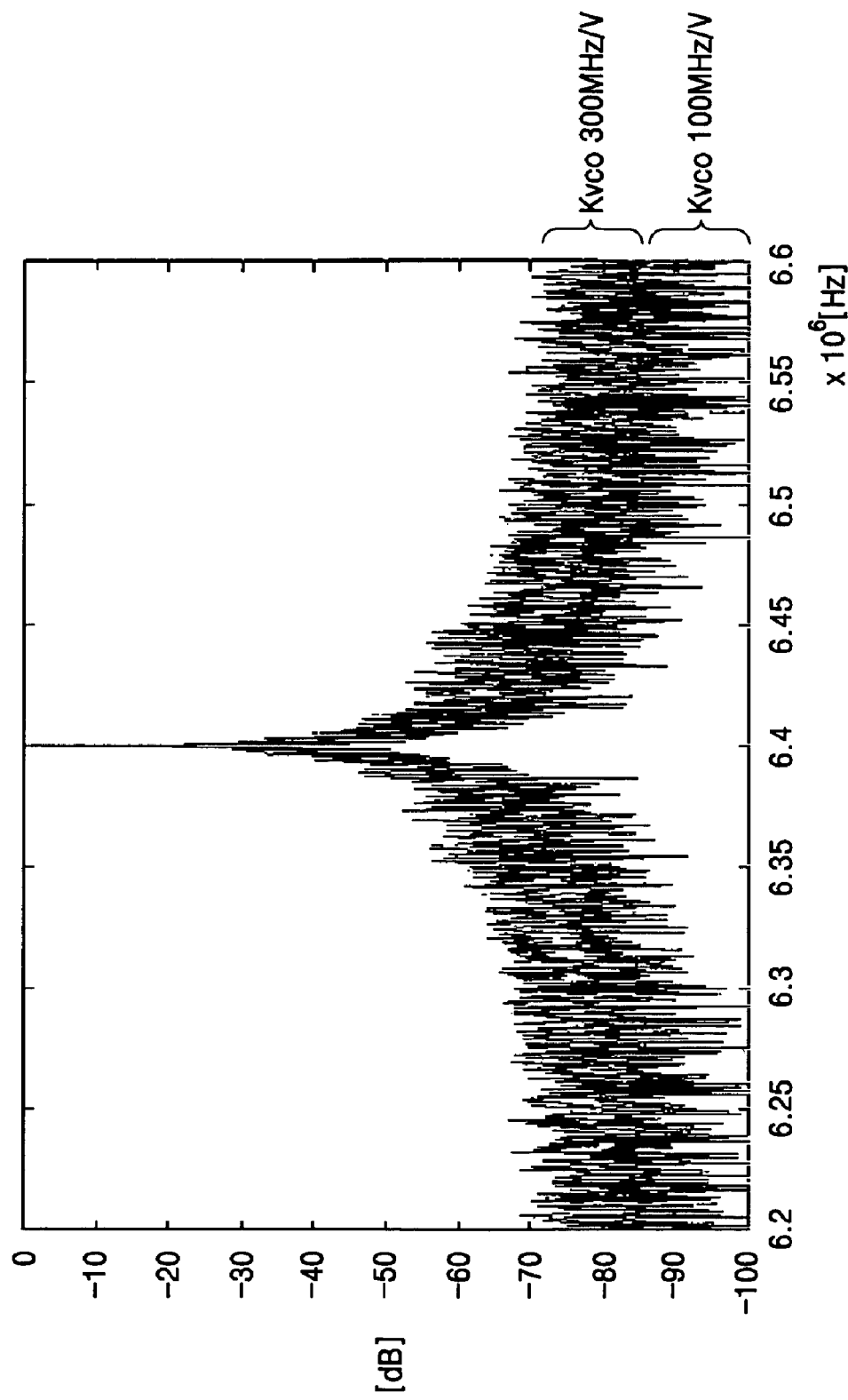
FIG. 7 illustrates noise simulation results obtained using the PLL circuit of FIG. 3.

Although the overall frequency range of gain of the VCO 340 of FIG. 3 that generates the output clock signal FCLK according to the tuning voltage Vcon generated in response to the first through third selection signals A, B, and C is similar to the frequency range of gain of the conventional VCO 130 of FIG. 1, the gain of the VCO 340 of FIG. 3 is reduced to ⅓ of the gain of the conventional VCO 130 of FIG. 1. FIG. 7 shows the simulated noise signal characteristics for the conventional VCO 130 of FIG. 1 at 300 MHz/V, and that of the VCO 340 of FIG. 3 at 100 MHz/V. Once gain of the VCO 340 of FIG. 3 is reduced to ⅓ of the gain of the conventional VCO 130 of FIG. 1, jitter and phase noise can be reduced to about 9.5 dB. Therefore, while jitter and phase noise is reduced, the frequency range of the PLL is maintained at a desired level.

Therefore, with the above described preferred embodiments, the PLL circuit is capable of generating an output clock signal FCLK that has three frequency ranges corresponding to three levels of tuning voltages Va, Vb and Vc, which are selectively generated in response to three selection signals A, B, and C. The PLL's power consumption is reduced and the output clock signal FCLK has reduced jitter and phase noise while having a wide frequency range.

While the above exemplary embodiments are described with the frequency range of the output clock signal being divided into three parts in response to three selection signals, it is readily appreciated by one of ordinary skill in the art that the frequency range of the output clock signal may also be divided into two or more parts in response to two or more selection signals. Also, it will be understood by those of ordinary skill in the art that various changes in form and details may be made therein without departing from the spirit and scope of the invention as defined by the appended claims and their equivalents.

What is claimed is:

1. A phase locked loop (PLL) circuit that generates an output clock signal that is phase-locked to a reference clock signal, the PLL circuit comprising:
   a phase detecting unit which detects a phase difference between the reference clock signal and the output clock signal and generates an up signal or a down signal based on the detected phase difference;
   a charge pump unit, which generates a pumping voltage in response to the up signal or down signal output from the phase detecting unit;
   a voltage-current converting unit, which receives the pumping voltage, converts the pumping voltage into a predetermined first current, copies the predetermined first current, generates at least two output voltages, and outputs a tuning voltage in response to predetermined selection signals; and
   a voltage control oscillator, which generates the output clock signal with a frequency that is proportional to the tuning voltage.

2. The PLL circuit of claim 1, wherein the voltage-current converting unit comprises:
   a voltage receiving unit, which receives the pumping voltage and converts the pumping voltage into the predetermined first current, and
   a MUX unit, which selects one of the at least two output voltages in response to the predetermined selection signals and outputs the tuning voltage.

3. The PLL circuit of claim 2, wherein the voltage receiving unit comprises:
   a first transistor that is an NMOS transistor whose gate is connected to a node that receives the pumping voltage;
   a second transistor that is an NMOS transistor, which is connected between a source of the first transistor and ground;
   a third transistor that is an NMOS transistor, which is connected between a fourth NMOS transistor and the ground, whose gate and drain are connected to a gate of the second transistor, and constitutes a current mirror with the second transistor;
   wherein the fourth transistor is an NMOS transistor whose source is connected to a node that receives the supply voltage and whose gate is connected to a node that receives a first voltage between a fifth transistor and the first transistor;
   wherein the fifth transistor is a PMOS transistor, which is connected between a node that receives a supply voltage and a drain of the first transistor and whose gate is connected to a node that receives a bias voltage;
   a sixth transistor that is a PMOS transistor whose source and gate are connected to a node that receives the supply voltage; and
   a seventh transistor that is an NMOS transistor, which is connected between the sixth transistor and the ground, whose gate and drain are connected to each other, and provides the first current.

4. The PLL circuit of claim 2, wherein the current copying unit comprises:
   a first transistor that is an NMOS transistor, through which the first current from the voltage receiving unit flows toward the ground;
   a second transistor that is a PMOS transistor, which is connected between a node that receives the supply voltage and the first transistor and whose drain and gate are connected to each other;
   a third and a fourth transistors that are PMOS transistors whose sources are connected to a node that receives the supply voltage, whose gates are connected to the gate of the second transistor, and which constitute a current mirror with the second transistor;
   a first resistor, which is connected to drains of the third and the fourth transistors;
   a second resistor, which is serially connected to the first resistor;
   a fifth transistor that is an NMOS transistor, which is connected between the second resistor and the ground and through which a sink current that operates the voltage receiving unit flows; and
   a sixth transistor that is an NMOS transistor whose gate and drain are connected to the second resistor and whose source is connected to the ground.

5. The PLL circuit of claim 4, wherein the gate of the seventh transistor of the voltage-current converting unit is connected to a gate of the first transistor of the current copying unit, and wherein the seventh transistor of the voltage-current converting unit and the first transistor of the current copying unit constitute a current mirror.

6. The PLL circuit of claim 1, further including a mode register (MRS) for providing the predetermined selection signals.

7. The PLL circuit of claim 1 further comprising a selection signal generating circuit that comprises:
   a frequency-voltage converting unit which converts a frequency of the reference clock signal into a first voltage;
   a reference voltage generating unit which generates a predetermined first reference voltage and a predetermined second reference voltage;
   a first amp unit which compares the first voltage to the predetermined first reference voltage;
   a second amp unit which compares the first voltage to the predetermined second reference voltage;
   a first switch which forwards an output of the first amp unit to a first latch in response to the reference clock signal;
   a second switch which forwards an output of the second amp unit to a second latch in response to the reference clock signal; and
   a decoding unit which inverts an output of the first latch, outputs a first selection signal as the inverted output of the first latch, receives the inverted output of the first latch and the output of the second latch to output a second selection signal, and outputs a third selection signal as the output of the second latch.

8. The PLL circuit of claim 7, wherein the decoding unit comprises:
   an inverter, which inverts the output of the first latch and outputs the first selection signal; and
   a NOR gate, which receives the output of the inverter and the output of the second latch and outputs the second selection signal.

9. A phase locked loop (PLL) circuit that generates an output clock signal that is phase-locked to a reference clock signal, the PLL circuit comprising:
   a phase detecting unit which detects a phase difference between the reference clock signal and the output clock signal and generates an up signal or a down signal based on the detected phase difference;
   a charge pump unit which generates a pumping voltage in response to the up signal or down signal output from the phase detector;
   a voltage receiving unit which receives the pumping voltage and converts the pumping voltage into a predetermined first current;

a current copying unit which copies the predetermined first current output from the voltage receiving unit and generates at least two output voltages;

a MUX unit which selects one of the at least two output voltages in response to a first through third selection signals and outputs a tuning voltage;

a frequency-voltage converting unit which converts a frequency of the reference clock signal into a predetermined voltage;

a reference voltage generating unit which generates a first reference voltage and a second reference voltage;

a first amp unit which compares the predetermined voltage to the first reference voltage;

a second amp unit which compares the predetermined voltage to the second reference voltage;

a first switch which forwards an output of the first amp unit to a first latch in response to the reference clock signal;

a second switch which forwards an output of the second amp unit to a second latch in response to the reference clock signal;

a decoding unit which inverts an output of the first latch, outputs the first selection signal as the inverted output of the first latch, receives the inverted output of the first latch and the output of the second latch, outputs the second selection signal, and outputs the third selection signal as the output of the second latch; and a voltage control oscillator which generates the output clock signal with a frequency that is proportional to the tuning voltage.

10. The PLL circuit of claim 9, wherein the voltage receiving unit comprises:

a first transistor that is an NMOS transistor whose gate is connected to a node that receives the pumping voltage;

a second transistor that is an NMOS transistor which is connected between a source of the first transistor and ground;

a third transistor that is an NMOS transistor which is connected between a fourth transistor and the ground, whose gate and drain are connected to a gate of the second transistor, and constitutes a current mirror with the second transistor;

wherein the fourth transistor is an NMOS transistor whose source is connected to a node that receives the supply voltage and a gate connected to a node that receives a first voltage between a fifth transistor and the first transistor;

wherein the fifth transistor is a PMOS transistor which is connected between a node that receives a supply voltage and a drain of the first transistor and whose gate is connected to a node that receives a bias voltage;

a sixth transistor that is a PMOS transistor whose source and gate are connected to a node that receives the supply voltage; and a seventh transistor that is an NMOS transistor which is connected between the sixth transistor and the ground, whose gate and drain are connected to each other, and provides the predetermined first current.

11. The PLL circuit of claim 9, wherein the current copying unit comprises:

a first transistor that is an NMOS transistor through which the predetermined first current output from the voltage receiving unit flows toward the ground;

a second transistor that is a PMOS transistor which is connected between a node that receives the supply voltage and the first transistor and whose drain and gate are connected to each other;

a third and a fourth transistors that are PMOS transistors whose sources are connected to a node that receives the supply voltage and whose gates are connected to the gate of the second transistor and which constitute a current mirror with the second transistor;

a first resistor which is connected to drains of the third and the fourth transistors;

a second resistor which is serially connected to the first resistor;

a fifth transistor that is an NMOS transistor which is connected between the second resistor and the ground and through which a sink current that operates the voltage receiving unit flows; and a sixth transistor that is an NMOS transistor whose gate and drain are connected to the second resistor and whose source is connected to the ground.

12. The PLL circuit of claim 11, wherein the gate of the seventh transistor of the voltage receiving unit is connected to a gate of the first transistor of the current copying unit, wherein the seventh transistor of the voltage receiving unit and the first transistor of the current copying unit constitute a current mirror.

13. A clock phase locking method for phase-locking an output clock signal to a reference clock signal, comprising:

detecting a phase difference between the reference clock signal and the output clock signal;

generating a pumping voltage in response to the detected phase difference;

receiving the pumping voltage and converting the pumping voltage into a predetermined first current;

copying the predetermined first current and generating a first through third output voltages;

selectively outputting one of the first through third output voltages as a tuning voltage in response to one of a first through third selection signals; and generating the output clock signal with a frequency that is proportional to the tuning voltage.

14. The clock phase locking method of claim 13, further including a mode register for providing the first through third selection signals such that they are selectively activated according to a frequency range of the reference clock signal.

15. The clock phase locking method of claim 14, further comprising:

converting a frequency of the reference clock signal into a predetermined voltage;

generating a first reference voltage and a second reference voltage;

comparing the predetermined voltage to the first reference voltage and generating a first selection signal;

comparing the predetermined voltage to the second reference voltage and generating a second selection signal;

performing a NOR operation on the first selection signal and the second selection signal and generating a third selection signal.

* * * * *